United States Patent [19]

Kim et al.

[11] Patent Number: 5,779,929
[45] Date of Patent: Jul. 14, 1998

[54] THIN FILM METALLIZATION FOR BARIUM NANOTITANATE SUBSTRATES

[75] Inventors: Tae Yong Kim, Boxford, Mass.; Dennis Lyle Krause, Atkinson, N.H.; Trac Nguyen, Haverhill, Mass.

[73] Assignee: Lucent Technologies Inc., Murray Hill, N.J.

[21] Appl. No.: 727,726

[22] Filed: Oct. 7, 1996

[51] Int. Cl.$^6$ ............................................. B44C 1/22
[52] U.S. Cl. ............................................. 216/100; 216/95
[58] Field of Search ........................ 216/95, 100, 49, 216/51

[56] References Cited

U.S. PATENT DOCUMENTS

| | | | |
|---|---|---|---|
| 4,902,607 | 2/1990 | Lee | 216/100 |
| 5,670,062 | 9/1997 | Lin et al. | 216/95 |

*Primary Examiner*—Deborah Jones

[57] ABSTRACT

The specification describes a metallization system for barium nanotitanate substrates that provides a combination of high dielectric properties and excellent metal adhesion. It comprises Ti, Pd or Ti/Pd alloy, and copper.

11 Claims, 1 Drawing Sheet

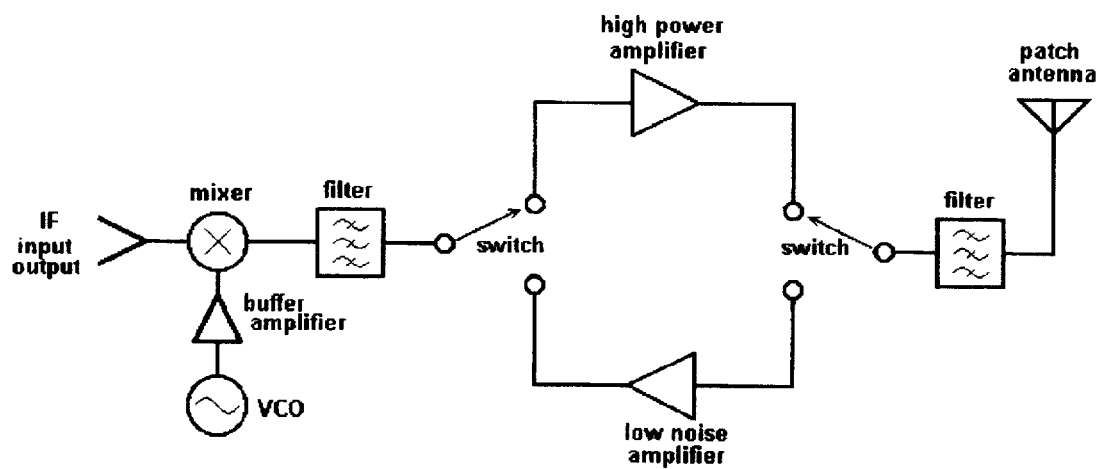

THIN FILM METALLIZATION FOR BARIUM NANOTITANATE SUBSTRATES

FIELD OF THE INVENTION

This invention relates to techniques for forming adherent metal patterns on barium titanate substrate. Such patterns are used to form interconnects and passive devices for compact electronic circuits.

BACKGROUND OF THE INVENTION

While large scale integrated circuits of ever increasing device density are the focus of most electronic and photonic development there continues to be an important need for larger scale microcomponents for radio frequency and related applications. Circuits for these applications also undergo continuous cost and size reduction to keep pace with modern electronics.

The primary RF device technology has been based on thick film metal patterns formed on ceramic substrates. Ceramics continue to be the substrate material of choice offering generally high dielectric constants. As device dimensions are reduced, and interdevice dimensions commensurately shrink, the need for very high dielectric substrates become more critical.

Barium titanate has been used as a substrate ceramic for many years. It is low cost and offers both low loss and desirable dielectric properties. Ceramic materials like barium titanate typically have several stoichiometric forms, and even tolerate non-stoichiometric variations. Thus barium titanate has been used in a variety of compositional forms. A barium titanate composition that exhibits an especially high dielectric constant, i.e. 38–40, is barium nanotitanate - $Ba_2Ti_9O_{20}$. But while desirable electrically, this material poses challenges in processing due to its brittle nature, and has been found in our work to have adhesion problems with deposited metal. These problems are amplified as the substrate size increases, and the thickness of metallization patterns decrease. The latter changes are required in the rapidly evolving communications industry, particularly in the manufacture of cellular communications products. These applications require efficient circuit operation at frequencies up to a few gigahertz. Of particular interest are the PCS bands at 1850–1990 MHz.

A standard technology for the manufacture of RF components, such as striplines, filters, mixers, etc., is thick film technology. Metallization systems useful in thick film form are well developed and widely used. However, as device dimensions shrink a point is reached where thick film metal is too thick to give the pattern resolution required by the device designer for complex microcircuits in current demand. Accordingly there is need in the art for a thin film metallization system for barium nanotitanate that provides the required adhesion in a thin film implementation, and can be patterned by photolithographic techniques to give reliable and reproducible pattern line width.

STATEMENT OF THE INVENTION

We have developed a metallization process for adherent thin films to barium nanotitanate substrates. The basic embodiment of the invention involves the use of a three layer metal system, as well as critical processing conditions. The preferred three layer system is titanium, titanium alloy, and copper (TAC). The titanium alloy is preferably a titanium-palladium alloy with 0.3–14 wt % palladium. A nearly equivalent system can be used in which the three layers are Ti/Pd/Cu (TPC). Successful implementation of the process requires critical annealing, adoption of one or more recommended deposition techniques, and post adhesion bake.

BRIEF DESCRIPTION OF THE DRAWING

The FIGURE is a circuit diagram of a device made using the process of the invention.

DETAILED DESCRIPTION

Substrates required for our specific applications were 3.75×4.5 inches and were 27 mils thick. Barium nanotitanate substrates were obtained from two manufacturers, Coors Ceramic and Transtech Incorporated. These substrates had the following nominal specifications:

| | |
|---|---|
| Density | 4.56 ± 0.5% |
| Dielectric Constant | 39.0 ± 1.0 |
| Thickness | 27 ± 2 mil |
| Width/Length | 3.75 in. ± 0.019 in., 4.5 in. ± 0.022 in. |
| Roughness | 40 μinches |

Those skilled in the art will recognize that the dielectric constant is very high. The high resistivity of this material is partly the result of stoichiometric variations to increase the oxygen content of the material well beyond that of the conventional $BaTiO_3$ ceramic substrate material. This stoichiometric adjustment is a trade-off of desirable electrical properties for desirable mechanical properties. The barium nanotitanate used for this invention is brittle, and the processing used for making devices using this material requires more critical controls than usually encountered. As pointed out above, stoichiometric variations in these materials are common. Accordingly, when we prescribe a barium nanotitanate material with a nominal stoichiometry of $Ba_2Ti_9O_{20}$ it should be understood that nearly equivalent results may be obtained with materials having stoichiometric variations as much as 10%. To provide through hole interconnections the substrates were laser drilled with a Melles Griot sealed beam $CO_2$ pulsed laser, Model CRF-2400, operating at 200±5 watts, with a dwell time of 0.4 sec, a pulse period of 6.0 millisec, and a pulse width of 0.7 millisec. After drilling, debris and coarse edges were removed with a standard bead blast.

The substrates were then annealed prior to metal deposition. It was found that adhesion of metallization was sensitive to the anneal conditions. Adhesion dependence on anneal temperature was measured by peel tests after metal deposition (below). Metal peeler test strips were formed with six 0.25 inch striplines on a photomask. The striplines were peeled off the substrate using a Unitek Micropull I pull tester with the aid of a Metek Accu Force II force gauge. On peeling each 0.25 in strip, a range of low (minimum) and high (maximum) value in peel strength was recorded. Peel strength was measured at four different locations on each side of the substrate, and the strips were pulled from both sides of the substrate. Results comparing anneal at 500° C. with anneal at 900° C. for Ti—Ti/Pd—Cu (TAC) and Ti—Pd—Cu (TPC) appear in the following table.

TABLE 1

| System | Adhesion peel strength range (lbs./in²)* | Annealing temp. °C. | |
|---|---|---|---|
| | | 500° C. | 900° C. |
| TAC | low | 0.72 | 1.33 |
| TAC | high | 0.93 | 1.47 |
| TPC | low | 0.84 | 1.30 |
| TPC | high | 1.08 | 1.40 |

*After sputter, before final adhesion bake

According to these and other test results the optimum anneal profile was determined to be 900° C.±25° C. for 4 hours annealing with 50° C. per hour ramp up and down from room temperature.

Annealing was done in an air environment. Due to the brittleness of the barium titanate material it is important that thermal shocks to the substrates during annealing, and during subsequent processing, be avoided.

The annealing schedule set forth above is regarded as defining optimum processing. However, it will be obvious to those skilled in the art that variations in the processing will still yield acceptable results. Accordingly, we recommend that the substrates be ramped at a rate of no more than 2° C. per minute, and the anneal temperature be in the range 800°–1100° C. for anneal times of two to eight hours.

After annealing the metal films are deposited on the barium nanotitanate substrates. Various techniques for depositing the metal layers could be used, e.g. evaporation, electroless techniques. The preferred technique is planar magnetron sputtering. In our experiments metal films were sputtered from metal targets using the following conditions:

| Total Source Power | <4.5 KW |
|---|---|
| Chamber Pressure | 2.0 microns |
| Argon Gas Flow | 15 sccm |
| Machine Cycle Time | 12/24 sec. |

These sputter parameters are conventional and those skilled in the art can use other values with similar effect. To minimize unnecessary thermal exposure of the substrates it is recommended that high power levels be avoided. Since the substrates were drilled with through holes in our work both sides of the substrates were metallized. The following Table summarizes the deposition data for a TAC trilevel metal:

TABLE 2

| Target metal | Power (KW/target) | Thickness (A) |
|---|---|---|
| Ti | 0.60 | 400 |
| Ti/5% Pd | 0.60 | 400 |
| Cu | 0.35 | 2000 |

While this trilevel system is preferred, substantial departures can be made while still retaining the advantages of the invention. The ranges for the thicknesses of the layers is constrained by the overall desired thickness of 1400 to 3500 Angstroms. Film thicknesses should be kept to a minimum to reduce film stresses from thermal process steps as well as internal mechanical stresses in the layers themselves. Within this limit each of the two constituent layers Ti and Ti/Pd or Pd should have a thickness of at least 200 A. It is desirable that the thickness of the copper layer provide sufficient conductivity for electroplating the copper layer. Thus it is preferred that the copper layer have a minimum thickness of at least 1000 angstroms.

In the sputtering operation we used for depositing the three layers, the TiPd layer was sputtered using a 5% Pd-95% Ti alloy target. It can also be co-sputtered.

A three level metallization system that is nearly equivalent to that of Table 2 can be formed by substituting a palladium layer for the titanium/palladium alloy. This embodiment (TPC), gives a metallization system that is nearly equivalent to the alloy version TAC. The same layer thickness limits apply to either version with the exception that the thickness of the palladium layer in the TPC system can be as low as 20 angstroms, which is the equivalent amount of palladium in a 5% Pd/Ti alloy 380 angstroms thick. The upper limit of palladium, corresponding to a 5% Pd/Ti alloy layer 2000 Angstroms thick, is approximately 100 angstroms.

The three level metallization is then patterned using a photoresist technique. The resist layer can be applied by various techniques. Due to the fragility of these substrates we elected a horizontal electrophoretic technique. The resist thickness was 15 µm, air baked at 100° C. for 1 hour. The resist was exposed, developed by standard techniques, and electroplated Cu, or CuNiAu.

The three level metallization is preferably etched by a wet etch technique. After photoresist removal, the following spray or dip wet etch process was used:

The exposed portions of the copper layer were etched using a standard copper etch with a 10–15 sec etch time. The exposed portions of both the titanium alloy layer and the titanium layer were etched using the same technique in a dilute HF solution (HF less than 1.2% concentration for 5–10 sec.) In the case of the TPC system the palladium layer can be removed by lift off using the same etch operation just described. Alternatively, dry etch or combinations of wet and dry techniques can be used according to procedures known in the art.

The patterned substrates are subjected to a final thermal stabilizing step which both stabilizes the metallization and also was found to significantly promote adhesion of the three level metallization to the substrates. Again the substrates should be ramped to temperature as prescribed earlier. The typical adhesion bake step, or resistor aging step, uses a bake temperature of 300° C. or higher and a bake step duration of several hours. Although this stabilizing bake is useful for our invention, under these conditions the copper layer oxidizes substantially, so that a relatively severe copper oxide clean is required after the bake step. We have found that this severe cleaning step can be avoided by maintaining the bake temperature below 225° C. and the bake duration less than 3 hours. We were able to achieve the maximum adhesion strength of 7.0–8.0 lbs/in$^2$ with a 2 hour nitrogen bake at 195° C. The post bake clean was 10% $H_2SO_4$, 50° C., for 3–4 minutes.

The processed substrates are then subjected to spin/rinse/dry, and diced either with a standard diamond saw, or with a Coherent Gas Laser Model 325, using:

| Power | 315 W at 40 mA |
|---|---|
| Pulse frequency | 1 Hz, min. setting |
| Pulse spacing | 0.008 inches |
| Feed rate | 0.50 inches/sec (the feed rate is 1/10 of normal to prevent slagging) |

We applied this device processing technique to building a PCS converter that upconverts an intermediate frequency to a radio frequency for transmitting, and downcoverts the RF to IF for receiving. The FIGURE shows the converter architecture.

A sampling of the devices in the circuit of the figure are described as typical applications for the metallization process of the invention.

The voltage controlled oscillator (VCR) was designed to operate at 1.77 GHz with a tuning range of 15 MHz. The resonator uses a half wavelength, 100 mil wide microstrip line which was printed on barium nanotitanate substrates according to the invention. The active circuit of the VCO uses an NEC NE68519 transistor which drew 15 mA at 5.2V. A 1.77 GHz buffer amplifier was included to increase the output power of the VCO and provide isolation from load changes. The buffer drew 3 mA at 2.5 V, produced 8 dB of gain and 16 dB of reverse isolation. The oscillator-buffer produces a 5 dBm signal at 1.77 GHz with a phase noise measuring approximately −90 dBc at 10 kHz offset from the oscillator frequency.

A singly balanced mixer was also designed using a microstrip quadrature printed on a barium nanotitanate substrate according to the invention, a 3 dB splitter, and a pair of antiparallel diodes. An additional 90 degree line was added to one of the diode arms of the splitter in order to make the signals at each diode 180° apart enabling the mixer to act as an upconverter as well as a downconverter. A low-pass filter consisting of surface mount inductors and capacitors was added at the IF port for proper mixer operation. Lastly, a shorted quarter-wave line at the local oscillator frequency was included for DC return. The circuit needed a 4.5 dBm of local oscillator power to operate with acceptably low conversion loss, which measured 6 dB, with a +1 dBm compression point.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Process for producing a metallized ceramic substrate, the substrate comprising barium nanotitanate, the process comprising the steps of:
   a. annealing the barium nanotitanate substrate at a temperature in the range 800°–1100° C. for a period of 2–8 hours;
   b. depositing a first layer comprising titanium on the annealed barium nanotitanate substrate;
   c. depositing a second layer of metal on the first layer, said second layer comprising a metal selected from the group consisting of palladium and an alloy of palladium and titanium.
   d. depositing a third layer comprising copper on the second layer.
   e. forming a photoresist pattern on said third layer leaving portions of the third layer exposed;
   f. etching away the exposed portions of the three level metal leaving the substrate and a pattern of three level metal; and
   g. baking said substrate to increase adhesion of the metal pattern to the barium nanotitanate substrate.

2. The process of claim 1 in which the second layer comprises an alloy of palladium and titanium.

3. The process of claim 2 in which the palladium titanium alloy contains 0.3–14 wt % palladium.

4. The process of claim 1 in which the combined thickness of the three layers is in the range 1400 to 3500 angstroms.

5. The process of claim 4 in which each layer is at least 200 angstroms thick.

6. The process of claim 1 further including, prior to step a., laser drilling holes through the substrate.

7. The process of claim 1 further including, after step d., electroplating copper on the third layer to increase the copper thickness.

8. The process of claim 7 further including, after electroplating the copper, electroplating Ni and Au layers on the electroplated copper.

9. The process of claim 1 in which the baking step g. comprises baking the substrate at a temperature of approximately 195° C. to approximately 300° C. for a period of 2–4 hours.

10. The process of claim 9 in which the substrate is baked at a temperature of less than 225° C. for a period of less than 3 hours.

11. The process of claim 9 in which the substrate is baked at approximately 195° C. for approximately 2 hours.

* * * * *